United States Patent
McArthur et al.

(10) Patent No.: US 6,208,439 B1
(45) Date of Patent: Mar. 27, 2001

(54) GENERALIZED GEOMETRIC TRANSFORMS FOR COMPUTER GENERATED HOLOGRAMS

(75) Inventors: Bruce B. McArthur; Adlai H. Smith, both of San Diego, CA (US)

(73) Assignee: Litel Instruments, San Diego, CA (US)

( * ) Notice: Subject to any disclaimer, the term of this patent is extended or adjusted under 35 U.S.C. 154(b) by 0 days.

(21) Appl. No.: 08/175,052

(22) Filed: Dec. 29, 1993

Related U.S. Application Data

(63) Continuation-in-part of application No. 07/940,008, filed on Sep. 3, 1992, now Pat. No. 5,362,940, which is a continuation of application No. 07/612,212, filed on Nov. 9, 1990.

(51) Int. Cl.[7] .............................. G03H 1/08; G03H 1/12; G03H 1/30; G03F 9/00
(52) U.S. Cl. .................................. 359/9; 359/11; 359/25; 359/26; 430/5
(58) Field of Search .................................. 359/9, 11, 25, 359/26; 430/5

(56) References Cited

U.S. PATENT DOCUMENTS

| | | | |
|---|---|---|---|
| 3,619,022 | * 11/1971 | Hirsch et al. | 359/9 |
| 4,547,037 | * 10/1985 | Case | 359/22 |
| 4,897,325 | * 1/1990 | Akkapeddi et al. | 430/5 |
| 5,194,971 | * 3/1993 | Haines | 359/9 |

OTHER PUBLICATIONS

Bryngdahl, Olof, et al. (1974) "Geometrical transformations in optics", *Journal of the Optical Society of America*, 64:315–322.

Herrmann, Jan (1980) "Least–squares wave front errors of minimum norm", *Journal of Optical Society of America*, 70:28–32.

Southwell, W.H., (1980) "Wave–front estimation from wave–front slope measurements", *Journal of the Optical of America*, 70:998–1005.

Case, S.K., et al. (1981) "Multifacet holographic optical elements for wave front transformations", Applied Optics, 20:2670–2675.

Fienup, J.R. (1981) "Reconstruction and synthesis applications of an iterative algorithm", *SPIE* 373:147–159.

Haugen, Paul R. (1983) "Image formation by multifacet holograms", Applied Optics, 22:2822–2829.

(List continued on next page.)

Primary Examiner—Audrey Chang
(74) Attorney, Agent, or Firm—Townsend and Townsend amd Crew LLP

(57) ABSTRACT

A technique for mapping working images to adjacently and continuously tiled subapertures having CGHs on a plate is disclosed with the result that the entirety of a working area of a plate is completely covered with working subapertures, these subapertures usually being rectangular. The design technique thereafter determines a phase function which approximately maps desired regions on each subaperture from portions of the working image in the workpiece plane. Steps in the process include first a determination of the size and shape of subapertures representing each feature. Second, a determination of the geometric transformation for each feature is made. Thereafter, backpropagation or other refinement to create the desired intensity profile at the workpiece is made. Although the techniques for determining the size and shapes of the subapertures can be used separately, or the technique for mapping each working image to is corresponding subaperture can be used separately, combination of all steps is preferred to gain full advantages of simpler, more inexpensive masks and greater potential capability for the ultimately produced subaperture broadcast plate.

14 Claims, 9 Drawing Sheets

OTHER PUBLICATIONS

Wallner, Edward P. (1983) "Optimal wave–front correction using slope measurements", Optical Society of America, 73:771–???.

Cederquist, Jack, et al. (1984) "Computer–generated holograms for geometric transformations" Applied Optics, 23:3099–3104.

Roux, Filippus S. (1993) "Diffractive optical implementation of rotation transform performed by using phase singularities", Applied Optics, 32:3715–3719.

Feldman, M. (1989) "Optical Interconnections for ULSI Computational Systems using Computer Generated Holography" PH.D. thesis, University of California, San Diego.

* cited by examiner

GENERALIZED GEOMETRIC TRANSFORMS FOR COMPUTER GENERATED HOLOGRAMS

This application is a Continuation-In-Part of USE OF FRESNEL ZONE PLATES FOR MATERIALS PROCESSING, Ser. No. 07/940,008 filed Sep. 3, 1992, now issued as U.S. Pat. No. 5,362,940 on Nov. 8, 1994, which was a File Wrapper Continuation of Ser. No. 07/612,212 filed Nov. 9, 1990.

This invention is directed to computer generated holograms which produce working images for machining or other processing of materials. In this disclosure, an apparatus and process is shown for taking desired shapes of working images on materials to be processed and tiling those images to substantially continuous subapertures on a fully filled plate or field for efficient working image broadcast. The disclosure relates to both overall continuous subapertures on a plate as well as configuring the individual subaperture for a particular working image.

BACKGROUND OF THE INVENTION

Computer generated holograms are known. Considerable developed has occurred related to such holograms. This development can be summarized.

In Use of Fresnel Zone Plates for Materials Processing, Ser. No. 07/612,212 filed Nov. 9, 1990, now Ser. No. 07/940,008 filed Sep. 3, 1992, the use of computer generated holograms to patterning is set forth. In the preferred embodiment, a plate containing a plurality of holograms is disclosed. Such holograms are confined to subapertures and scanned by coherent light to produce from the subapertures as they are scanned the desired working images for processing materials.

In a Continuation-In-Part Patent Application to be filed Jan. 3, 1994, improved techniques of dimensioning and fabricating the subaperture, creating amplitude modulation with the phase plate, and finally controlling amplitude with optical features beyond the limit of prior art producible optical elements are disclosed. The apparatus for the process, the process and the plate for utilization in the process are set forth.

This application is addressed to how subapertures on plates should be dimensioned and placed side-by-side for efficient scanning and broadcast of their respective images. In a first portion of this application, a technique for dimensioning and placing subapertures in contiguous side-by-side relation is set forth. In a second portion of the application, the problem of taking a subaperture and obtaining from the subaperture a desired real working image profile is set forth. The preferred embodiment incudes combining both of these techniques to secure a small, compact plate configuration which can be efficiently scanned to produce a desired array of working images.

A very broad class of applications of computer generated holograms (CGH) is to reshaping the intensity pattern of a coherent source in one plane (CGH plane usually contained in a transmissive plate) so that it takes on some specified form on another surface. Examples of this are materials patterning (disclosed in the above referenced patent applications) and optical interconnects (set forth in "Optical Interconnections for VLSI Computational Systems using Computer Generated Holography", M. Feldman, Ph.D. thesis, University of California at San Diego, 1989).

In general, we have found that the best techniques to creating arbitrarily complex patterns of working images utilizes subaperture broadcast CGH. Then the problem of generating the entire pattern efficiently subdivides itself into the more numerous but more tractable problem of placing the subapertures efficiently and thereafter producing each feature from its respective subaperture.

At this juncture, the substance of the referred to patent applications can be generalized.

In a patterning application, to produce an array of circular vias or working images of different sizes, the actual shape and configuration of the working images or vias is assumed at a working distance from a plate on to which the subaperture CGHs are to be formed. Once the shapes and their working distances are known, the phase and amplitude modulation required on the plate are determined by backpropagation, Gerchberg Saxton, or some other technique.

An example of this is shown in FIGS. 1–3. These figures illustrate backpropagation as applied to making a feature. Referring to FIG. 1, imaginary point source P1 is located behind the workpiece surface 3, on which feature (here along line 1, 2) is to be made. FIG. 2 shows the amplitude profile (A) defining the feature between points 1, 2. In addition to amplitude modulation, the feature can also subject the outgoing wave to phase modulation. Exemplary phase modulation is illustrated by FIG. 3.

It has previously been emphasized that there is generally a need to laterally displace a subaperture generating a working image. This need arises from design flexibility. If the point source, P1, can be shifted to position P1' this has the effect of changing the subaperture size and location from line 4–5 to line 6–7. The change in subaperture size results in a change in gain.

In the backpropagation technique, a spherical wave emanating from a point, line or plane source is incident from behind the feature and its wavefront is modulated by the features on the mask; especially the wave's amplitude is modulated in accordance with the feature shape. In addition to the amplitude, we can also modulate the outgoing phase. As will hereafter be set forth, it is the modulation of that outgoing phase to which a portion of the following disclosure is directed.

DEFINITION OF TERMS

In the following disclosure, some consistent terminology can be useful. While such terminology is not universal, it will be consistently used herein.

A "plate" will consist of a hologram containing two or more subapertures. This plate is usually transmissive—although it can be reflective The plate contains optical features in side-by-side relationship which alter coherent light of a specific frequency on the plate in phase and amplitude. "Subapertures" in a plate will each contain at least one computer generated hologram (CGH). Such a CGH will produce at least one "working image"—an image formed from constructively interfering light in three dimensional space at a working distance from the plate that is typically utilized to process materials. Such processing of materials is due to the exposure of the materials to the light of the real working images—usually causing ablation of vias or other shapes.

SUMMARY OF THE INVENTION

A technique for mapping working images to adjacently and continuously tiled subapertures having CGHs on a plate is disclosed with the result that the entirety of a working area of a plate is completely covered with working subapertures, these subapertures usually being rectangular. The design technique thereafter determines a phase function which approximately maps desired regions on each subaperture from portions of the working image in the workpiece plane. Steps in the process include first a determination of the size and shape of subapertures representing each feature. Second, a determination of the geometric transformation for each feature is made. Thereafter, backpropagation or other refinement to create the desired intensity profile at the workpiece is made. Although the techniques for determining the size and shapes of the subapertures can be used separately, or the technique for mapping each working image to is corresponding subaperture can be used separately, combination of all steps is preferred to gain full advantages of simpler, more inexpensive masks and greater potential capability for the ultimately produced subaperture broadcast plate.

The subaperture size and shape is determined so that the patterned area on the CGH has a compact footprint occupying a minimum area. Any array of polygons contiguously tiled together so that their respective boundaries either form common boundaries with adjacent polygons or borders to the working area of a plate, will produce this desired condition. In a simplified and preferred tiling technique, rectangles of varying size and shape which fit together to form a single larger rectangle are the usual result. Other shapes which tile together conveniently are also possible including trapezoids, triangles, hexagons, and the like are included Having decided on the subaperture geometry, an idealized mapping from subaperture to working image is performed. Both subaperture and working image are divided up into subregions, these subregions mapped onto each other. Two techniques can be used to carry out this mapping. They are:

1) Perimeter mapping. In this technique, a finite thickness outline going around the boundary is mapped onto a similar finite thickness boundary of the desired feature or working image. The process continues for successive inwardly extending perimeters until complete mapping of the subaperture and working image occurs.

2) Areal mapping. Here the subaperture shape is divided into equal area parts. The desired feature is similarly subdivided into equal area parts. Mapping occurs with the closest corresponding areas of the working image mapping to the closest corresponding areas of the subaperture.

Thereafter a phase map best approximating this ideal mapping is determined.

In the preferred process, once the subapertures are located, determining the phase and amplitude mapping of each discrete subaperture so that it can produce the desired working image must occur. Geometric transformations for such conversion here disclosed use a ray optics approximation to obtain the desired mapping. In utilizing this ray optics approximation, three techniques for determining geometric transformations can be used:

1) A "tilt solver" technique which is the preferred technique and new with this disclosure generates an approximate but continuous phase mapping. The starting point is a mapping from the desired shape in the CGH plane to the desired working image shape. It then uses a least square solution for the coefficients of the phase expansion to arrive at the phase function best approximating the mapping. The initial map can be arbitrarily specified but there are two systematic techniques for determining it.

2) Conformal mapping can be used. This is a known technique. It is restricted in applicability by the need to find a transformation and the subsequent process of making it useful. However, the simplest version of conformal mapping is a generalized quadratic phase which finds use in practice because it is the only geometric transformation with constant geometric gain.

3) Other mapping techniques can be used. For example, it is possible to use any mapping that seems about right, that is any mapping that comes close (or "out of the hat"). The subsequent backpropagation step will render the resultant image more exact. We have found that the end result is usually not as good as that generated by methods outlined above.

The geometric transformations described above and not further refined suffer from one or all of the following defects; no account of diffractive effects, non uniform gain (undesirable intensity profile), imprecise definition of the desired feature. In some cases, the image as determined may be acceptable, but in most cases the further refinements herein set forth are required.

The refinements consist of correcting the resulting image for all of the above defects. A consequence of this refinement techniques is that the subaperture in the CGH plane is now only approximately as that subaperture originally specified. However, these changes are usually slight, so that the resulting set of subapertures can be tiled or arranged as originally intended through a combination of slightly overlapping them and possibly slightly expanding the spacing between them. This refinement can be carried out by backpropagation, Gerchberg-Saxton simulated annealing or other known techniques.

Once the subapertures are determined, and each subaperture constructed as to its constituent parts, the plate containing the subapertures with their respective CGHs is then fabricated using known techniques.

DESCRIPTION OF THE PREFERRED EMBODIMENT

A very broad class of applications of computer generated holograms (CGHs) is to reshape the intensity pattern of a coherent light source in one plane (CGH plane or plate plane) so that the produced working image takes on some specified form on another surface. Examples of this are materials patterning of the above reference patent applications or optical interconnects as set forth in "Optical Interconnections for VLSI Computational Systems using Computer Generated Holography", M. Feldman, Ph.D. thesis, University of California at San Diego, 1989.

We have found that the best technique to creating arbitrarily complex patterns utilizes subaperture broadcast CGH. The general technique for doing this can be described with respect to FIGS. 1–3.

Figure 1:
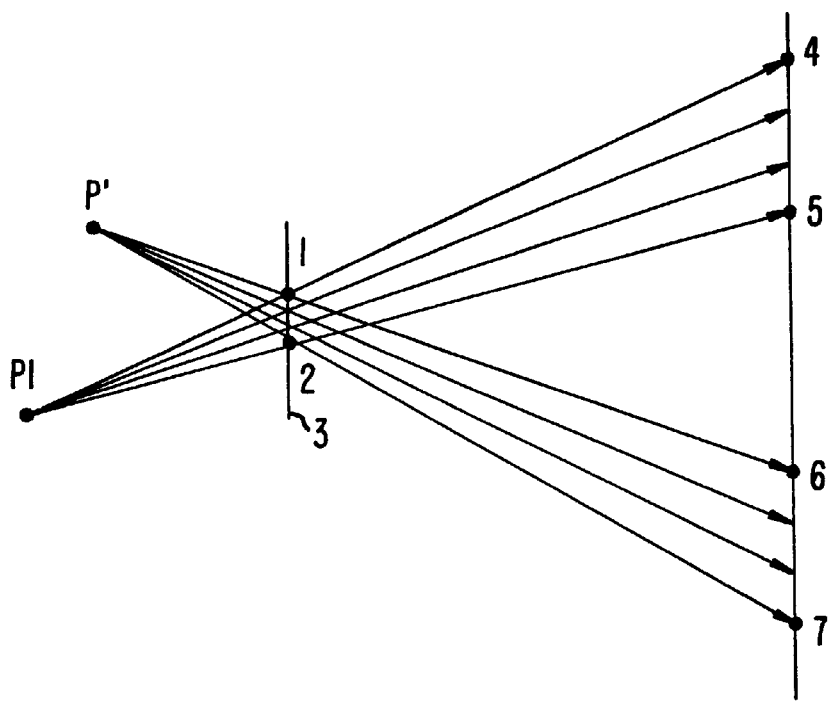
FIG. 1 is an illustration of the backpropagation as applied to determining the phase and amplitude modulation of a subaperture.
Figure 2:
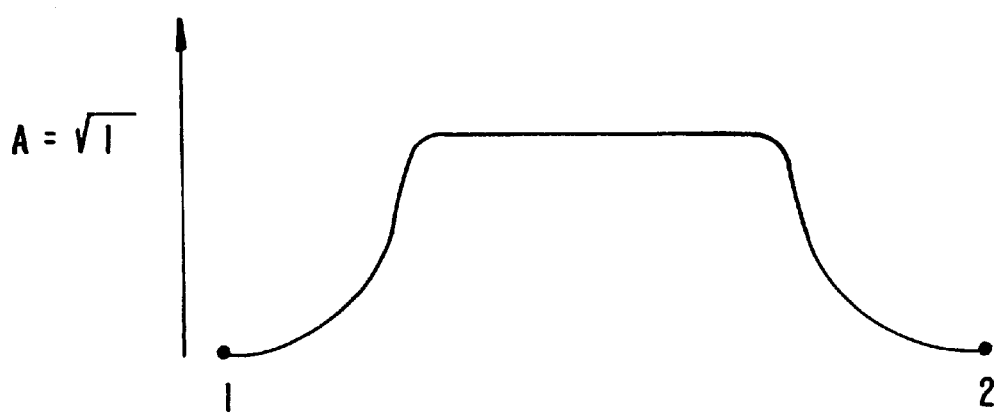
FIG. 2 is the desired amplitude profile in the image plane.
Figure 3:
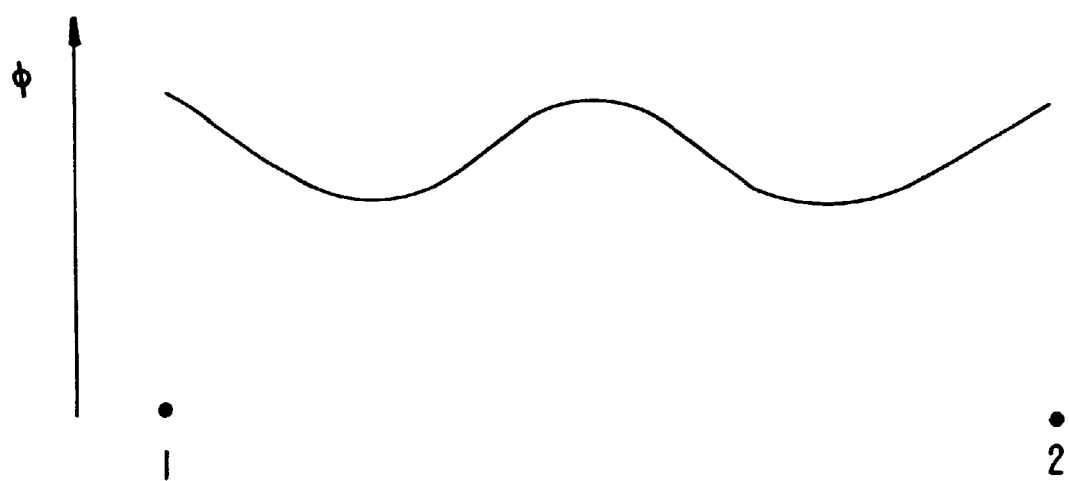
FIG. 3 is the desired phase profile in the image plane.
Figure 4:
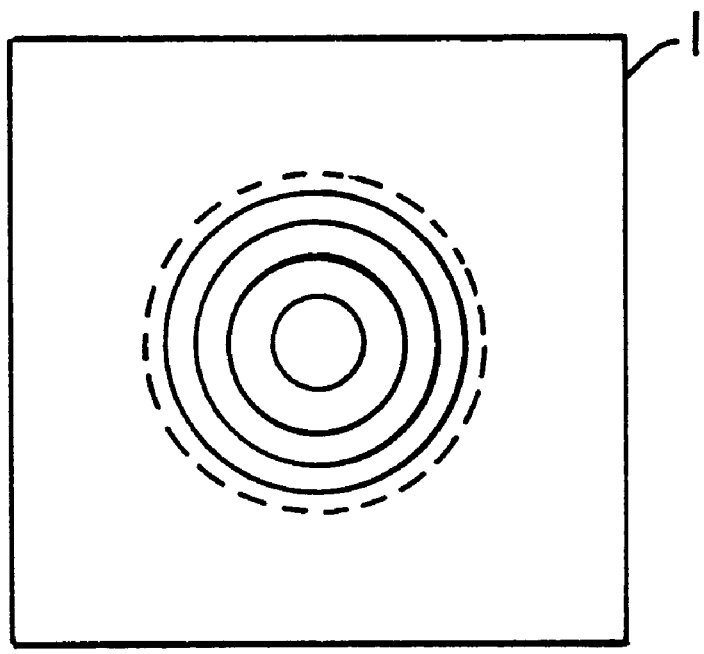
FIG. 4 is the plan view of a CGH containing a single circular subaperture which produces a single feature.
Figure 5:
FIG. 5 is the intensity profile on the workpiece surface generated by the CGH of FIG. 4.
Figure 6:
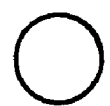
FIG. 6 is the plan view of the circular feature corresponding to FIG. 5.
Figure 7:
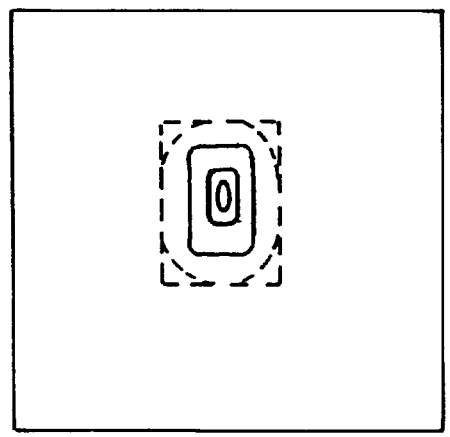
FIG. 7 is the plan view of a CGH containing a single rectangular subaperture designed in accordance with this invention.
Figure 8:
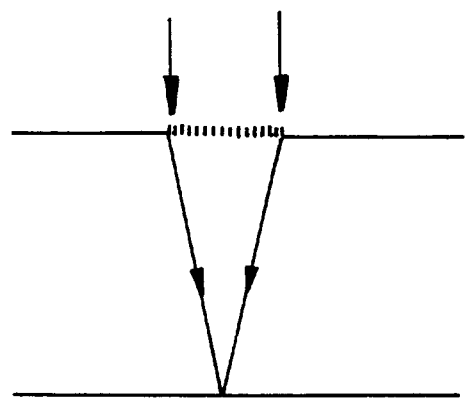
FIG. 8 is a side view showing the illumination and feature formation of the CGH of FIG. 7.
Figure 9:
FIG. 9 is a section of the intensity profile generated by the CGH of FIG. 7.
Figure 10:
FIG. 10 is the plan view of a circular feature formed by the CGH of FIG. 7.

FIGS. 1–3 illustrate backpropagation as applied to making a feature. Referring to FIG. 1, an imaginary point source P1 is located behind the workpiece surface 3, on which feature or working image (here line 1–2) is to be made. FIG. 2 shows the amplitude profile A defining the feature between points 1–2. In addition to amplitude modulation, the feature can also subject to outgoing wave to phase modulation. This phase modulation is illustrated by FIG. 3.

As a practical matter, it is often necessary to shift the position of the working image relative to the subaperture producing that image. FIG. 1 illustrates how such a shift can be made. Point source P1, can be shifted to position P1' which has the effect of changing the subaperture size and location from line 4–5 to line 6–7.

FIGS. 1–3 rely on the backpropagation technique. In this technique, a spherical wave emanating from a point, line or plane source is incident from behind the working image that is intended to be created. The wavefront produced at the subaperture is modulated by the features on the mask; especially the wave's amplitude is modulated in accordance with the feature shape.

In addition to the amplitude, modulation could occur to the outgoing phase to produce this result. It is the modulation of that outgoing phase to which the present invention is directed.

If the phase at the workpiece is not modulated, then in the case of circular working images, the resulting footprint of the beam in the CGH plane is circular. That is, the subaperture corresponding to that feature is circular. For an array of circular vias, each via with a different size, the corresponding set of subapertures are circles and require packing together in the workpiece plane. This is generally inefficient unless all vias have the same diameter and take a circular form. In this latter case, a hexagonal pattern can be used. It will be found that hexagonal close packing is about 91% efficient.

The efficiency here used can be easily understood. Specifically, the plate on which the subapertures are placed in side-by-side relation has "unused" areas between the borders of the plate. In the case of the circular vias packed in a hexagonal array, these unused areas will constitute about 9% of the total. We have previously shown that it is desirable to "scan" a plate to serially produce desired images. (See Use of Fresnel Zone Plates for Materials Processing, Ser. No. 07/612,212 filed Nov. 9, 1990, now Ser. No. 07/940,008 filed Sep. 3, 1992.) Such scanning can occur either by having a beam continuously traverse the subapertures of a plate or alternately to serially step to generally constant sized locations on the plate and produce an image.

For masks with a greater variety of features, the shapes of the resulting subapertures are quite varied, and to fit them together with minimal overlap is generally an involved problem. Efficiency of packing further declines.

Areas on a plate not occupied by subapertures are wasted. Working efficiency of the scanning beam declines. Further, occurrence of required working image displacement from the subaperture producing the working image increases. This can lead to decreased size of the optical features on a plate in the particular subapertures producing the working image. As small optical features in subapertures render the subaperture more difficult to fabricate, such subapertures with unnecessary small features are to be avoided. It is therefore desirable to have subapertures which fit or tile together more closely than an otherwise best available assembly of the subapertures would permit.

Figure 13A:
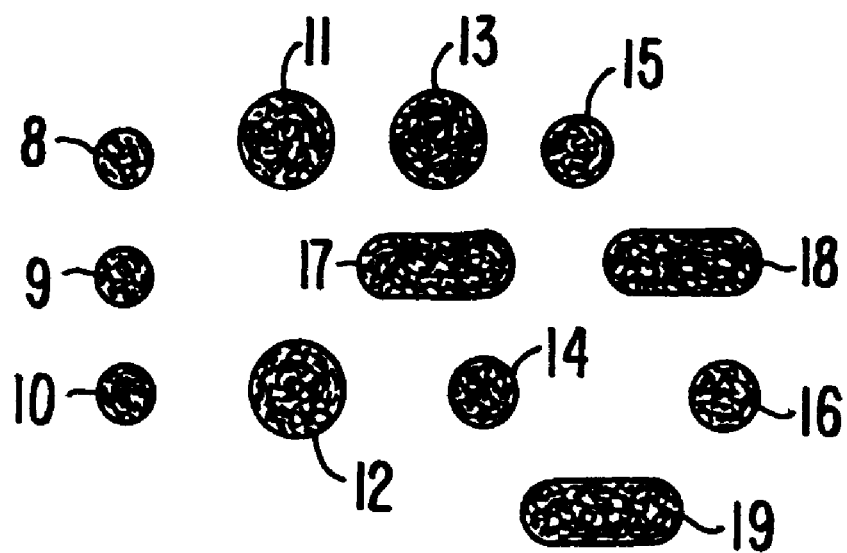
FIGS. 13A and 13B are respective plan views of an array of vias desired with FIG. 13B being the vias close to actual size and FIG. 13A being the vias magnified for increased understanding.
Figure 13B:
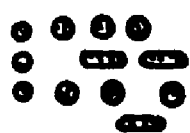

An example can best illustrate this condition. FIG. 13B is a sketch of an actual via pattern similar to those actually encountered in fabrication of circuit boards. FIG. 13A is an enlargement of the pattern of FIG. 13B. If we applied the method of backpropagation without any additional phase modulation as in FIG. 3, the resulting subapertures would be approximately scaled up versions of the features.

Figure 11:
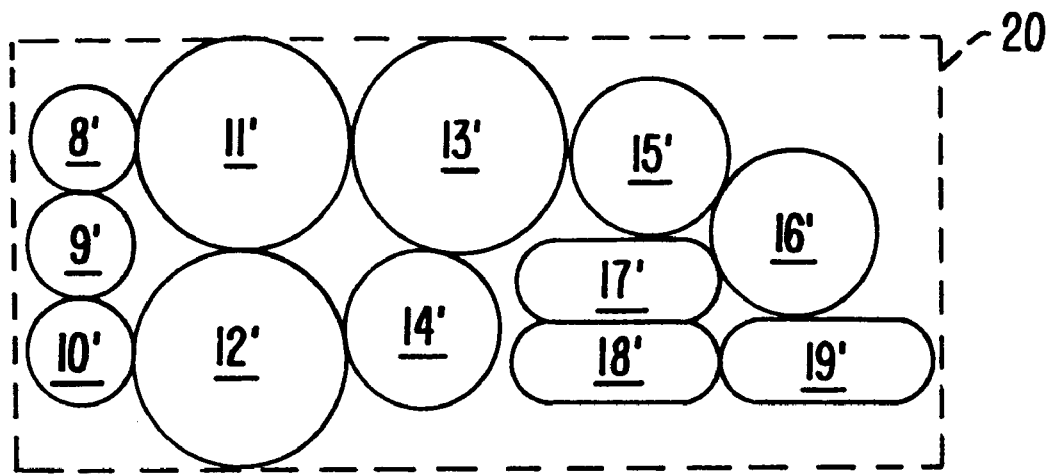
FIG. 11 is the plan view of a portion of a CGH in accordance with utilizing projections according to the techniques of FIGS. 1–3 for obtaining the most efficient packing of a plate for projecting side-by-side subapertures.

We know from the illustration of FIGS. 1–3, that it is possible to displace the working images from a particular subaperture relative to the subaperture. Assuming such displacement is used only when absolutely required, when the resulting subapertures are packed together so as to have a compact footprint, the resulting subaperture array would be FIG. 11.

It remains to place the randomly determined subapertures on a plate within a "working area." This working area is that area of the plate, scanned by a beam of coherent light to produce—usually in succession—the working images of the subapertures for processing materials.

The area 20 is the rectangular envelope circumscribing the collection of subapertures of the plate of this example. This area 20 determines the region which is scanned by the coherent source. In this case, only 59% of the rectangle is occupied by active subapertures due to the difficulties in packing different shapes.

This problem as applied to an entire plate containing subapertures with CGH has not been discussed; that is the problem of efficiently utilizing space on a plate consisting of an array of subapertures, with each subaperture containing a CGH for generating at least one working image for processing materials.

Techniques for modifying single subapertures have been discussed. Known in the literature as geometrical transformations, the following articles generally relate to this area: "Geometrical Transformations in Optics", O. Bryngdahl, JOSA, vol 64, pg 1092, August 1974; "Computer Generated Holograms for Geometric Transformations", J. Cederquist, A. Tai, Appl. Opt., vol 23, pg 3099, September 1984; "Diffractive Optical Implementation of Rotation Transform Performed by using Phase Singularities", Appl. Opt., vol 32, no. 20, Pg 3715, July 1993.

A generalized description of the process of modifying single apertures can be helpful. If x=(x1,x2) is a point on a CGH where the phase applied in the desired order is φ(x), then at a distance z (the working distance between the plane of the plate and the working image) a light ray striking the CGH perpendicular at x is deflected to the point;

$$x'=x'(x) \qquad (0)$$

$$x'=x+z/k * \mathrm{grad}(\phi(x)) \qquad (1)$$

where k=2π/λ, λ is the wavelength, grad is the gradient operator. Equation (1) is valid in the ray optics approximation, it excludes diffraction effects. Furthermore, it assumes the workpiece surface is also a plane parallel to the CGH. This is the simplest geometry and will be assumed throughout the subsequent discussion, however the worksurface need not be plane in general.

A geometric interpretation of (1) is that it maps a region R in the CGH plane to a region R' in the workpiece plane. The phase φ and the shape of the initial region R' determine the shape of the final region R'. It is desirable to be able to map arbitrarily shaped regions R onto other arbitrarily shaped regions R'. Now it can be shown that (1) reduces to a conformal mapping of complex variables and therefore by Cauchy's theorem the desired mapping always exists. However the complex mapping can be difficult to find and it generally produces a nonuniform intensity profile, while a uniform intensity profile is generally desired.

The technique of faceted transforms is another method for generating maps, eq. (0), which can be designed to have more uniform intensity profiles on the workpiece surface. These techniques are set forth in "Multifacet Holographic Optical Elements for Wave Front Transformations", S. Case, P. Haugen, 0. Lokberg, Appl. Opt., vol 20, no 15, pg 2670 August 1981; and "Image Formation by multifacet Holograms", P.

Haugen, H. Bartlet, S. Case, Appl. Opt., vol 22, no 18, pg 2822, September 1983.

Unfortunately, drawbacks exist. These drawbacks include the phase being inherently discontinuous leading to superfluous edge diffraction. Furthermore, the method of generating them is not systematic.

All of these known techniques suffer from at least the following shortcomings.

1. There is no discussion of tiling up arrays of subapertures to make an entire, compact array.
2. The map as defined by equation (1) is difficult to find in general.
3. Gain is not uniform, e.g. the intensity profile is almost guaranteed not to be as required.
4. Diffraction effects not accounted for in any way, all of these schemes are based on ray optics.

The process we use to tile the working area of a plate with contiguous subapertures can now be described. We provide a plate defining an active area for receiving computer generated holograms within said plurality of side-by-side subapertures.

The required working images will determine the area required of the subaperture producing it. So the areas of each of the subapertures will be known.

At this point the working area of the plate is divided into contiguous polygonal subapertures, each subaperture producing a working image. The polygonal subapertures have boundaries which are either common to the working area on the plate or shares with another polygon in the working area. These polygons, when taken together, form a continuous tiling over the working area of the plate.

Having determined the form and position of the polygonal subapertures (for example, subapertures 8, 9, 10, 11, 12, 13, 14, 15, 16, 17, 18 and 19 in FIG. 13A), a computer generated hologram generating the desired working image is patterned.

Returning to FIGS. 13A and 13B, this process is illustrated as applied to a heterogeneous via or working image array. We assume that it is desired to pattern this array. FIG. 13A is an enlarged and numbered view of the same via array. Utilizing the usual backpropagation technique without any additional phase (φ=0 in FIG. 3) produces subapertures (i.e. 8', 9', 10', 11', 12', 13', 14', 15', 16', 17', 18', 19' in FIG. 11) which are scaled up (in size) versions of the original features. Packing them together to fit in as small a circumscribing rectangle as possible, they fit together as in FIG. 11. There they occupy <60% of total area enclosed in dashed rectangle 20. This leads to scanning inefficiencies and more costly CGH because of finer and more numerous features. Improvements in plate construction will result in having subapertures which pack together efficiently eliminating the dead space evident in FIG. 11.

Having determined the general layout of the subapertures with respect to the working images, the working images must be produced from each subaperture. Since the particular shape of the desired subaperture rarely conforms to the "natural" shape produced by working image using the simplest backpropagation technique, a conformance must be made.

We propose a solution to this problem. Specifically, we use an array of contiguous polygons to contiguously tile a working area of a plate with an array of CGHs. The straight line boundaries of each polygon either from common boundaries with adjacent polygons or borders of the working area of the plate. There results a subaperture array which can be scanned by a beam of coherent light with maximum efficiency.

Figure 12:
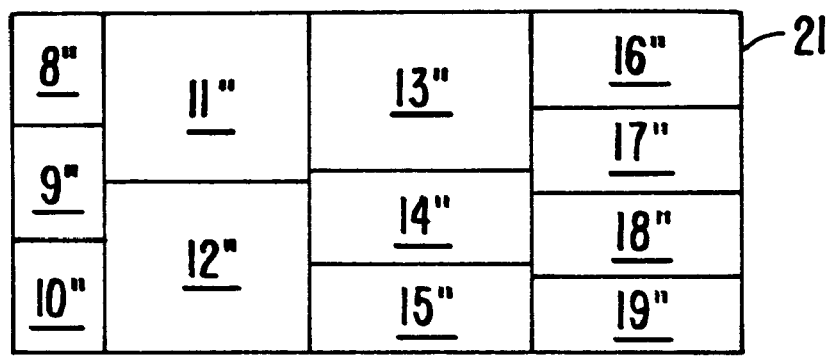
FIG. 12 is the plan view of a portion of a CGH in accordance with the tiling technique of the present invention.

FIG. 12 illustrates such a result. There we have a group of rectangular subapertures 8", 9", 10", 11", 12", 13", 14", 15", 16", 17", 18", 19" that fit tightly together. Determining a grouping as in FIG. 12 can be readily understood. Since the required area of subaperture j (j is an index running from 8–19 in the present example, each subaperture/feature having a unique index) is known (=$A_j$), the total area of all subapertures is known ($\Sigma A_j$=A). Pick a convenient aspect ratio for the bounding rectangle, 21, then the dimensions of the entire rectangle are determined by the aspect ratio and area A.

Now decide how many columns of shapes the overall pattern will have and which subapertures go into each column. Sum the area of subapertures that go into a column, this determines the column width, wc; the column height was determined when we determined the rectangle size. Now in that column, the height of a rectangle is determined by the subaperture area $A_j$ according to h=$A_j$/wc. In this fashion, we can pack collections of subapertures with arbitrary areas and shapes into compact, rectangular arrays. The shape of each resulting subaperture is now rectangular.

Figure 14:
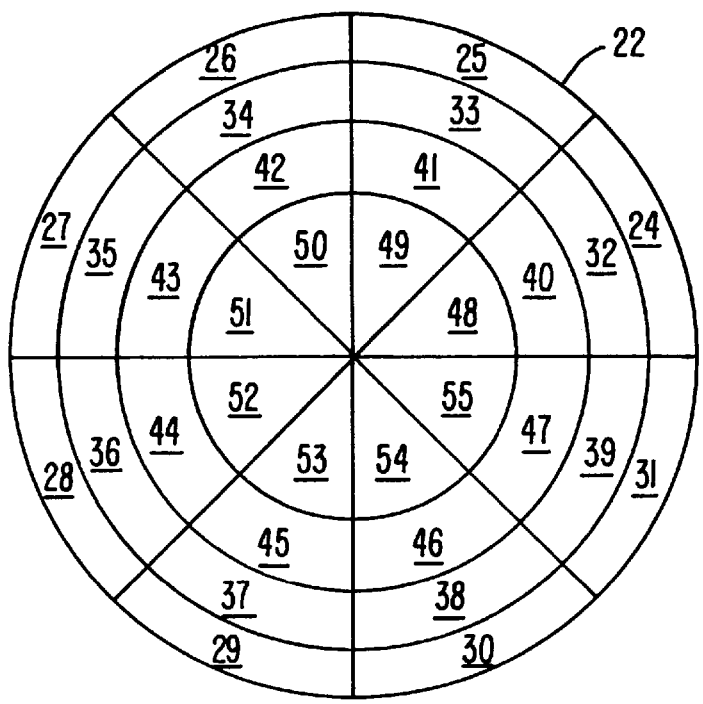
FIG. 14 is a plan view of a circular feature to be made, divided up into equal area perimeter cells for compartmentalizing a working image in accordance with the teachings of this disclosure illustrating a technique for forming the subaperture of FIGS. 7–10.
Figure 15:
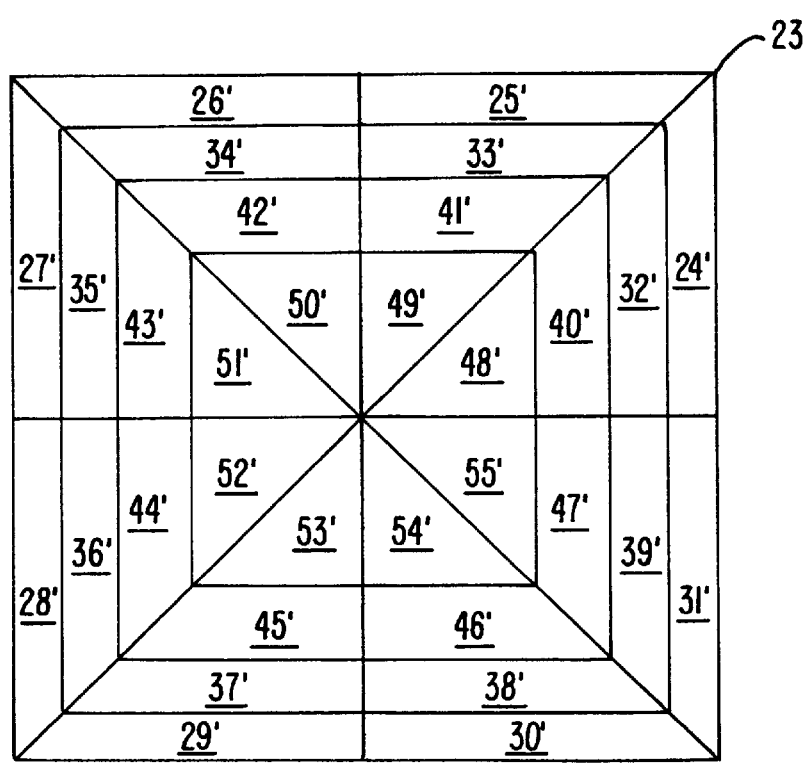
FIG. 15 is a plan view of the subaperture intended to create the feature of FIG. 14, this aperture divided up into equal area perimeter cells.
Figure 16:
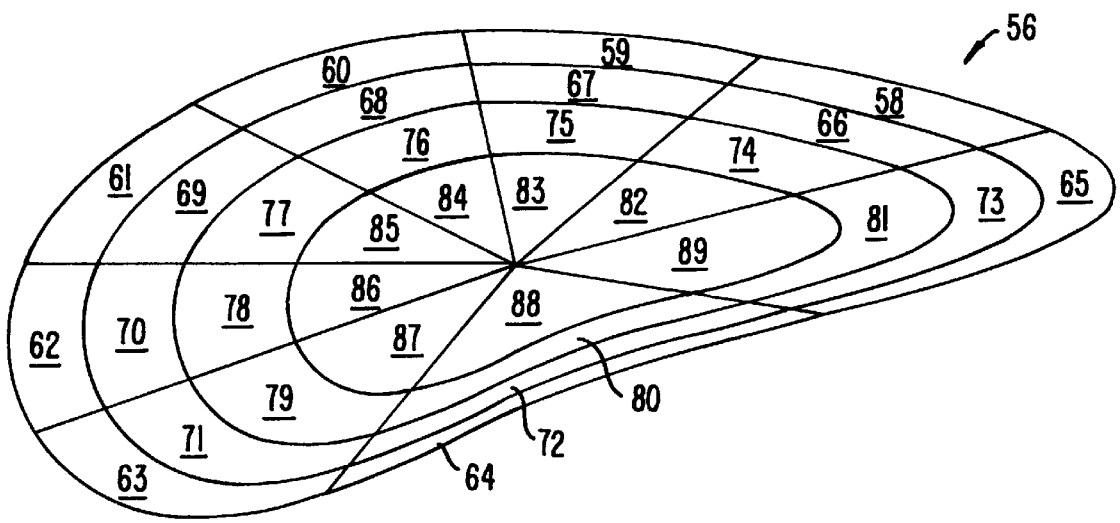
FIG. 16 is a plan view of a complex feature to be made divided up into equal area perimeter cells.
Figure 17:
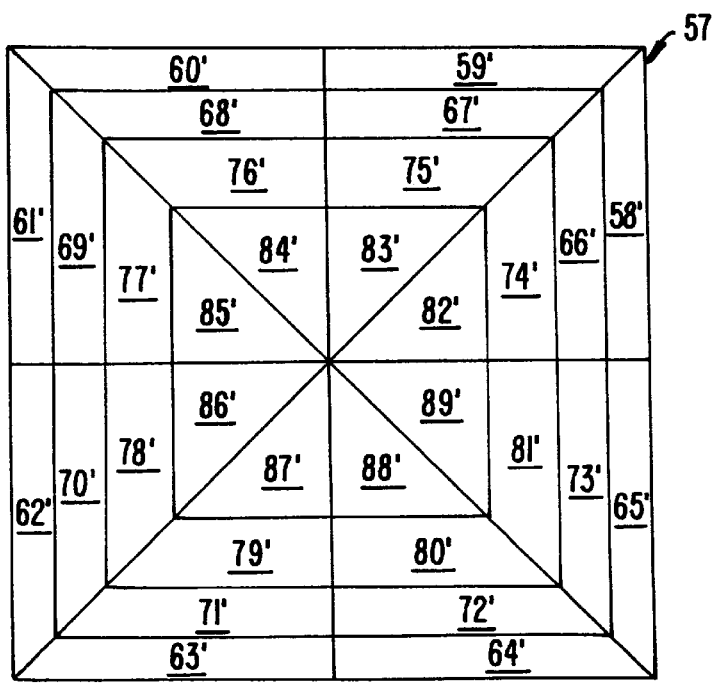
FIG. 17 is a plan view of the subaperture intended to create the feature of FIG. 16 divided up into equal perimeter cells.
Figure 18:
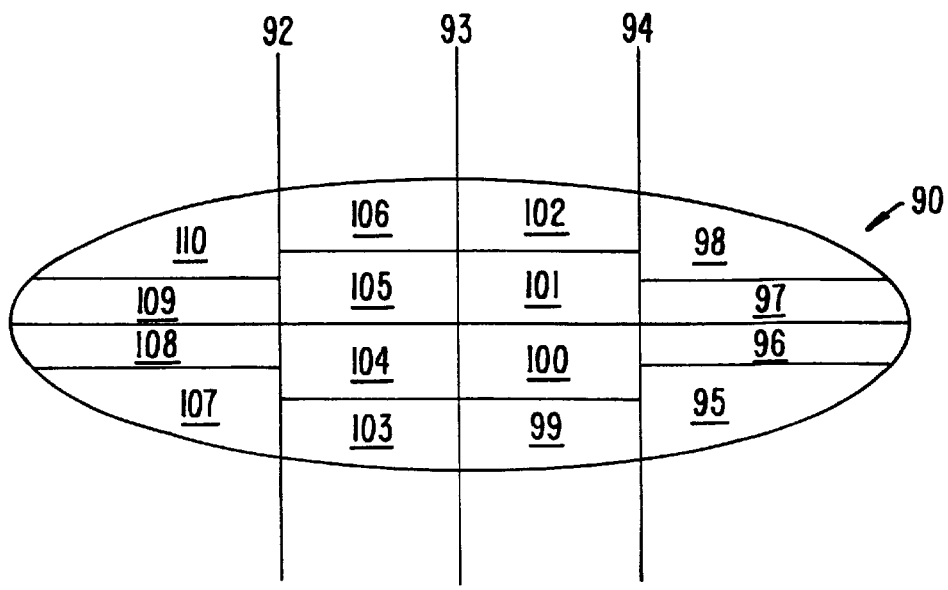
FIG. 18 is a plan view of a complex feature to be made, divided up into equal areal cells; and, FIG. 19 is a plan view of the subaperture intended to make the feature if FIG. 18, divided up into equal areal cells.
Figure 19:
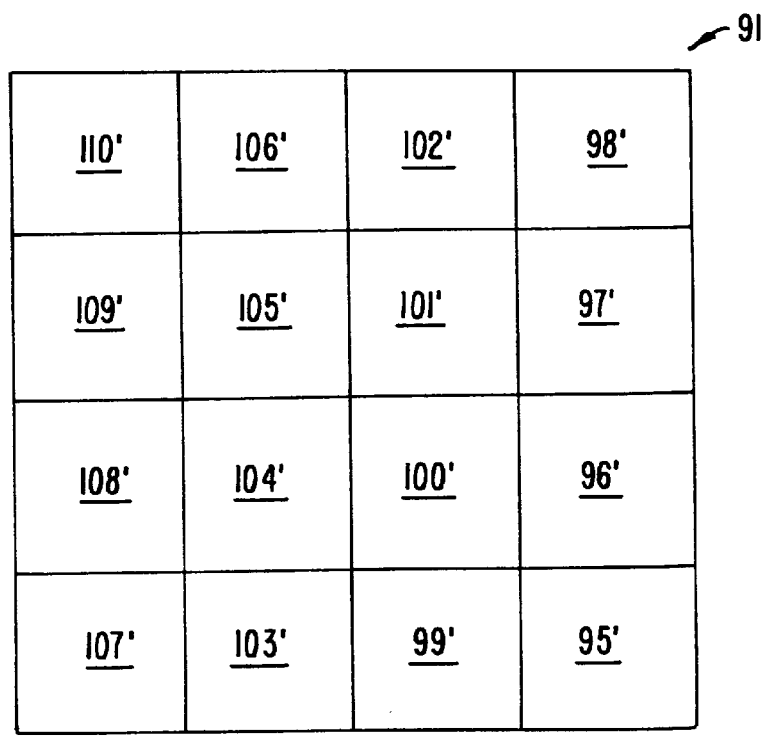

We include herewith in FIGS. 14, 16 and 18, working images divided into image areas. Likewise, in respective FIGS. 15, 17, and 19 will included respective subapertures.

For example, working image segments 24–55 of the working image 22 of FIG. 14 correspond to subaperture segments 24'–55' of subaperture 23 of FIG. 15. Likewise, working image segments 58–89 of the working image 56 of FIG. 16 correspond to subaperture segments 24'–55' of subaperture 57 of FIG. 17. Finally, working image segments 95–110 of the working image 90 of FIG. 18 correspond to subaperture segments 95'–110' of subaperture of FIG. 19.

Tiling schemes other than rectangular are possible. Regular arrays of hexagons, trapezoids, triangles and other polygons can be used for subapertures.

Having determined the shape and location of each subaperture, the problem of determining a phase function which maps the subaperture onto the polygon subaperture— here a rectangle—can now be addressed.

The geometric optics approximation of the mapping is described by equation (1). The preferred technique for computing the initial phase function φ is the tilt solver method. Having determined the desired coordinate mapping x->x' of eq. (0), the phase is written as a sum of terms;

$$\phi(x) = \sum_1 a_1 Z_1(x) \qquad (2)$$

$Z_1$ are orthogonal polynomials on the rectangular subaperture.

Substituting equation 1 interior of equation 2 and minimizing the mean square mapping error is the equivalent of minimizing the quantity E given by the following equation:

$$E = \sum_j \left( x_j - x'_j + \frac{z}{k} \sum_1 a_1 \nabla Z_1(x_j) \right)^2 \qquad (3)$$

This is a standard least square's problem. Techniques such as the normal equation, singular value decomposition (SVD), and other well known methods for determining the $a_1$'s from equation (3) can be utilized. In the optical context, this problem reduces to that problem encountered before in adaptive optics.

In the present context, the normal equation or SVD can be used to efficiently solve equation (3). The method of determining the phase function via equations (2) and (3) is described herein as the "tilt solver" technique.

The next method is a less refined technique for determining file mapping that uses a "close" approximation for the initial phase mapping. An example is the anamorphic mapping at an elliptical subaperture onto a circular feature. It is given by:

$$\phi(x, y) = -\frac{kx^2}{2f_x} - \frac{ky^2}{2f_y} \qquad (4)$$

where $f_x$ and $f_y$ are not equal. This turns an ellipse with x:y axes in the rations of $1/(1-z/f_x):1/(1-z/f_y)$ into a circle a distance z beyond the CGH. This mapping produces a constant intensity profile in the geometric optics approximation and it can be generalized to include translations and skews. However, (4) is more difficult to refine than a phase determined by the tilt solver method.

A known technique for determining the phase mapping is the conformal mapping technique. Being described in the prior art section it requires little discussion here except to note that it to can provide a starting point for the mapping. Again, this is generally a poorer starting method than that provided by the tilt solver technique.

Having determined the geometric mapping, we then have a starting point for subsequent refinement. For the purposes of suppressing diffraction artifacts, achieving the desired intensity profile (uniform gain) or better definition of the feature, improvement in the ray optics map is needed. One method for carrying this out is wave optics backpropagation. Its use has been previously described.

Another technique is the Gerchberg Saxton technique described in "Reconstruction and Synthesis Applications of an Iterative Algorithm", J. R. Fienup, SPIE vol. 373, pg 147, 1981. The result of applying either of these techniques is a subaperture which not only has the approximate desired shape but closely conforms to the desired feature. Yet another method is simulated annealing.

What is claimed is:

1. A method of generating from a subaperture on a plate a working image array for processing materials comprising the steps of:
   dividing the subaperture into a plurality of subaperture segments;
   providing subaperture segments which produce each working image of the working image array independent of all other subaperture segments present;
   dividing the working image into a corresponding plurality of working image segments, each working image segment having a centroid;
   mapping of each subaperture segments to the centroid of a corresponding working image segment;
   determining a phase mapping which best approximates a mapping of each subaperture segment onto the corresponding working image segment;
   determining a phase produced by the subaperture at the location of the desired working image; and,
   back propagating the desired working image using the phase as determined at the working image to adjust amplitude and phase of the subaperture so that it produces the desired working image.

2. A method of generating from a subaperture on a plate a working image for processing materials according to claim 1 and including the steps of:
   dividing the subaperture into a plurality of rows and columns having discrete subaperture segments; and,
   dividing the working image into a corresponding plurality of rows and columns having discrete and corresponding working image segments.

3. A method of generating from a subaperture on a plate a working image for processing materials according to claim 1 and including the steps of:
   dividing the subaperture into a plurality of perimeter segments having discrete subaperture segments; and,
   dividing the working image into a corresponding plurality of perimeter segments having discrete and corresponding working image segments.

4. A method of generating from a subaperture on a plate a working image for processing materials according to claim 1 and including the steps of:
   dividing the subaperture into a plurality of equal area segments; and,
   dividing the working image into a plurality of corresponding equal area segments.

5. A method for the generation of a plate having a plurality of side-by-side subapertures, each subaperture for generating at least one working image, with all working images of all subapertures producing a working image array including a plurality of side-by-side working images on a workpiece, the method comprising the steps of:
 providing subapertures which produce each working image of the working image array independent of all other subapertures present;
 providing a plate and defining a working area for receiving computer generated holograms at least equal to a sum of each required area for the plurality of side-by-side subapertures;
 dividing the working area into contiguous polygonal subapertures, each subaperture producing a working image, the contiguous polygonal subapertures having boundaries which are either common boundaries with adjacent polygons or boundaries of the working area on the plate, whereby all subapertures in the working area are continuously tiled and adjacent to other subapertures to form an uninterrupted continuum over the working area of the plate;
 producing a computer generated hologram by placing optical features on each subaperture to produce the working image from each subaperture;
 dividing the subaperture into a plurality of subaperture segments;
 dividing the working image into a corresponding plurality of working image segments;
 creating an ideal mapping of each subaperture segment to the centroid of a corresponding working image segment;
 determining a phase mapping which best approximates the ideal mapping of each subaperture segment onto the corresponding working image segment;
 determining a phase produced by the given subaperture at the location of the desired working image;
 back propagating the desired working image using the phase as determined at the working image to adjust amplitude and phase of the subaperture so that it produces the desired working image.

6. A method for the generation of a plate having a plurality of side-by-side subapertures according to claim 5 including the step of:
 providing the plate with a rectangular working area for receiving the subapertures.

7. A method for the generation of a plate having a plurality of side-by-side subapertures according to claim 5 including the step of:
 the step of generating computer generated holograms uses some subapertures that project the working images of the computer generated holograms at an angle with respect to the surface of the plate.

8. A method for the generation of a plate having a plurality of side-by-side subapertures according to claim 5 and including the steps of:
 dividing the subaperture into a plurality of rows and columns having discrete subaperture segments; and,
 dividing the working image into a corresponding plurality of rows and columns having discrete and corresponding working image segments.

9. A method for the generation of a plate having a plurality of side-by-side subapertures according to claim 5 and including the steps of:
 dividing the subaperture into a plurality of perimeter segments having discrete subaperture segments; and,
 dividing the working image into a corresponding plurality of perimeter segments having discrete and corresponding working image segments.

10. A method for the generation of a plate having a plurality of side-by-side subapertures according to claim 5 and including the step of:
 dividing the subaperture into a plurality of equal area segments; and,
 dividing the working image into a plurality of equal area segments.

11. A subaperture on a plate for producing a working image for processing materials comprising:
 at least one working image divided into a plurality of working image segments;
 a subaperture divided into a plurality of subaperture segments, each subaperture segment corresponding to a working image segment and producing that working image segment independent of all other subapertures and having sufficient area to produce the working image segment, the subaperture having an area equal to a sum of the sufficient areas to produce the working image segments:
 each subaperture segment mapped to the centroid of a corresponding working image segment and having a phase mapping which best approximates the ideal mapping of each subaperture segment onto the corresponding working image segment;
 a phase produced by the given subaperture at the location of the desired working image;
 all the working image segments combined and back propagated using the phase as determined at the working image to adjust amplitude and phase of the subaperture so that it produces the desired working image.

12. A subaperture on a plate for producing a working image for processing materials according to claim 11 comprising:
 the subaperture divided into a plurality of perimeter segments having discrete subaperture segments; and,
 the working image divided into a corresponding plurality of perimeter segments having discrete and corresponding working image segments.

13. A subaperture on a plate for producing a working image for processing materials according to claim 11 comprising:
 the subaperture divided into a plurality of equal area segments; and,
 the working image divided into a plurality of equal area segments.

14. A subaperture on a plate for producing a working image for processing materials according to claim 11 comprising:
 the subaperture having a plurality of rows and columns having discrete subaperture segments; and,
 the working image having a corresponding plurality of rows and columns having discrete and corresponding working image segments.

* * * * *